(12) United States Patent
Kim et al.

(10) Patent No.: US 6,940,129 B2
(45) Date of Patent: Sep. 6, 2005

(54) DOUBLE GATE MOS TRANSISTORS

(75) Inventors: Sung-Min Kim, Incheon (KR);
Dong-Gun Park, Gyeonggi-do (KR);
Chang-Sub Lee, Gyeonggi-do (KR);
Jeong-Dong Choe, Gyeonggi-do (KR);
Shin-Ae Lee, Seoul (KR); Seong-Ho Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/715,664

(22) Filed: Nov. 18, 2003

(65) Prior Publication Data
US 2004/0140520 A1 Jul. 22, 2004

(30) Foreign Application Priority Data
Jan. 20, 2003 (KR) ................... 10-2003-0003807

(51) Int. Cl.[7] ............................................. H01L 21/84
(52) U.S. Cl. ...................... 257/347; 257/365; 257/401
(58) Field of Search .......................... 257/63, 65, 347, 257/349, 351, 352, 365, 401

(56) References Cited

U.S. PATENT DOCUMENTS 6,004,837 A    12/1999  Gambino et al. ........... 438/157
6,495,403 B1 * 12/2002  Skotnicki et al. .......... 438/157

FOREIGN PATENT DOCUMENTS

EP            1091417 A1 *  4/2001   ......... H01L/29/786

* cited by examiner

Primary Examiner—Minhloan Tran
Assistant Examiner—Thomas Dickey
(74) Attorney, Agent, or Firm—Myers Bigel Sibley & Sajovec, P.A.

(57) ABSTRACT

A double gate MOS transistor includes a substrate active region defined in a semiconductor substrate and a transistor active region located over the substrate active region and overlapped with the substrate active region. At least one semiconductor pillar penetrates the transistor active region and is in contact with the substrate active region. The semiconductor pillar supports the transistor active region so that the transistor active region is spaced apart from the substrate active region. At least one bottom gate electrode fills a space between the transistor active region and the substrate active region. The bottom gate electrode is insulated from the substrate active region, the transistor active region and the semiconductor pillar. At least one top gate electrode crosses over the transistor active region and has at least one end that is in contact with a sidewall of the bottom gate electrode. The top gate electrode overlaps with the bottom gate electrode and is insulated from the transistor active region. Methods of fabricating such transistors are also provided.

20 Claims, 16 Drawing Sheets

DOUBLE GATE MOS TRANSISTORS

CLAIM OF PRIORITY AND RELATED APPLICATION

This U.S. nonprovisional patent application claims priority under 35 U.S.C. § 119 from Korean Patent Application No. 2003-3807 filed on Jan. 20, 2003, the disclosure of which is hereby incorporated by reference in its entirety.

FIELD OF THE INVENTION

The present invention relates to semiconductor devices and manufacturing methods thereof, and more particularly, to double gate MOS transistors and manufacturing methods thereof.

BACKGROUND OF THE INVENTION

Many semiconductor devices employ MOS transistors as switching devices. As semiconductor devices become more highly integrated, the MOS transistors have, typically, been scaled down. The electrical characteristics of the MOS transistors may directly influence performance of the semiconductor devices.

Recently, double gate MOS transistors have been introduced to improve the electrical characteristics of MOS transistors that are suitable for the highly-integrated semiconductor device. A double gate MOS transistor, typically, includes a source region and a drain region respectively formed at both sides of a channel region. A top gate electrode and a bottom gate electrode are disposed on and under the channel region. In addition, the top gate electrode is electrically connected to the bottom gate electrode. Therefore, if a gate voltage higher than the threshold voltage is applied to the gate electrodes, inversion layers are formed at a top surface and a bottom surface of the channel region. As a result, the double gate MOS transistor exhibits a large on-current even in a limited area as compared to a conventional MOS transistor having a single gate electrode. Accordingly, a semiconductor device employing double gate MOS transistors may provide a higher operating speed than devices without such transistors.

Double gate MOS transistors are described, for example, in U.S. Pat. No. 6,004,837 to Gambino, et al., entitled "dual-gate SOI transistor". According to U.S. Pat. No. 6,004,837, a MOS transistor is provided having a top gate electrode and a bottom gate electrode, formed on a silicon on insulator (SOI) substrate.

SUMMARY OF THE INVENTION

Embodiments of the present invention provide a double gate MOS transistor. The double gate MOS transistor includes a substrate active region defined in a semiconductor substrate and a transistor active region located over the substrate active region and overlapped with the substrate active region. At least one semiconductor pillar penetrates the transistor active region and is in contact with the substrate active region. The semiconductor pillar supports the transistor active region so that the transistor active region is spaced apart from the substrate active region. At least one bottom gate electrode fills a space between the transistor active region and the substrate active region. The bottom gate electrode is insulated from the substrate active region, the transistor active region and the semiconductor pillar. At least one top gate electrode crosses over the transistor active region and has at least one end that is in contact with a sidewall of the bottom gate electrode. The top gate electrode overlaps with the bottom gate electrode and is insulated from the transistor active region.

In further embodiments of the present invention, the semiconductor pillar is a single semiconductor pillar penetrating a portion of the transistor active region and the bottom gate electrode is a single bottom gate electrode.

In additional embodiments of the present invention, the semiconductor pillar is a single semiconductor pillar dividing the transistor active region into a first transistor active region and a second transistor active region, and dividing the bottom gate electrode into a first bottom gate electrode and a second bottom gate electrode. In such embodiments, the top gate electrode may include a first top gate electrode crossing over the first transistor active region and a second top gate electrode crossing over the second transistor active region. The first and second top gate electrodes overlap with the first and second bottom gate electrodes respectively. At least one end of the first top gate electrode contacts a sidewall of the first bottom gate electrode and at least one end of the second top gate electrode contacts a sidewall of the second bottom gate electrode.

In yet further embodiments of the present invention, the semiconductor pillar includes a central semiconductor pillar intersecting the central portions of the transistor active region and the bottom gate electrode and a first semiconductor pillar and a second semiconductor pillar are located at opposite sides of the central semiconductor pillar respectively. The transistor active region between the first and second semiconductor pillars is divided into a first transistor active region and a second transistor active region separated by the central semiconductor pillar and the bottom gate electrode between the first and second semiconductor pillars is divided into a first bottom gate electrode and a second bottom gate electrode separated by the central semiconductor pillar. In certain embodiments of the present invention, the top gate electrode includes a first top gate electrode crossing over the first transistor active region and a second top gate electrode crossing over the second transistor active region. The first and second top gate electrodes overlap with the first and second bottom gate electrodes respectively. At least one end of the first top gate electrode is in contact with a sidewall of the first bottom gate electrode and at least one end of the second top gate electrode is in contact with a sidewall of the second bottom gate electrode.

In additional embodiments of the present invention, the semiconductor pillar includes a first semiconductor pillar and a second semiconductor pillar located on both edges of the transistor active region and the bottom gate electrode respectively. The top gate electrode may include first and second parallel top gate electrodes crossing over the transistor active region. At least one end of the first and second top gate electrodes is in contact with sidewalls of the bottom gate electrode.

In other embodiments of the present invention, a double gate MOS transistor includes an isolation layer formed at a predetermined region of a semiconductor substrate to define a substrate active region and a transistor active region disposed over the substrate active region and overlapped with the substrate active region. A central semiconductor pillar intersects the central portion of the transistor active region to divide the transistor active region into a first transistor active region and a second transistor active region and contacts the substrate active region. The central semiconductor pillar supports the first and second transistor active regions so that the first and second transistor active regions are spaced apart from the substrate active region. A first bottom gate electrode substantially fills a space between the first transistor active region and the substrate active region. The first bottom gate electrode is insulated from the substrate active region, the first transistor active region and the semiconductor pillar. A second bottom gate electrode substantially fills a space between the second transistor active region and the substrate active region. The second bottom gate electrode is insulated from the substrate active region, the second transistor active region and the semiconductor pillar. A first top gate electrode crosses over the first transistor active region and has both ends that are in contact with sidewalls of the first bottom gate electrode. A second top gate electrode crosses over the second transistor active region and has both ends that are in contact with sidewalls of the second bottom gate electrode. The first and second top gate electrodes overlap with the first and second bottom gate electrodes respectively.

In further embodiments of the present invention, an isolation impurity region is formed at a surface of the substrate active region contacting the central semiconductor pillar, the isolation impurity region having a different conductive type from the semiconductor substrate. A top surface of the isolation layer may be located at the same or a lower level as a top surface of the substrate active region. A common drain region may also be formed at the central semiconductor pillar as well as the first and second transistor active regions between the first and second top gate electrodes. A first source region may be formed at the first transistor active region that is adjacent to the first top gate electrode and opposite the common drain region. A second source region may be formed at the second transistor active region that is adjacent to the second top gate electrode and opposite the common drain region.

In other embodiments of the present invention, a double gate MOS transistor includes an isolation layer formed at a portion of a semiconductor substrate to define a substrate active region and a transistor active region disposed over the substrate active region and overlapped with the substrate active region. A first semiconductor pillar and a second semiconductor pillar are placed at both sides of the transistor active region respectively, the first and second semiconductor pillars contacting the substrate active region. A central semiconductor pillar intersects a central portion of the transistor active region to divide the transistor active region into a first transistor active region and a second transistor active region and contacts the active region. The central semiconductor pillar supports the first and second transistor active regions so that the first and second transistor active regions are spaced apart from the substrate active region. A first bottom gate electrode substantially fills a space between the first transistor active region and the substrate active region, the first bottom gate electrode being insulated from the substrate active region, the first transistor active region, the first semiconductor pillar and the central semiconductor pillar. A second bottom gate electrode substantially fills a space between the second transistor active region and the substrate active region, the second bottom gate electrode being insulated from the active region, the second transistor active region, the second semiconductor pillar and the central semiconductor pillar. A first top gate electrode crosses over the first transistor active region and has both ends in contact with sidewalls of the first bottom gate electrode. A second top gate electrode crosses over the second transistor active region and has both ends in contact with sidewalls of the second bottom gate electrode, the first and second top gate electrodes overlapping with the first and second bottom gate electrodes respectively.

Isolation impurity regions may also be formed at the substrate active region contacting the first and second semiconductor pillars and the central semiconductor pillar, the isolation impurity regions having a different conductive type from the semiconductor substrate. A top surface of the isolation layer may be located at a same level or a lower level as that of the substrate active region. A common drain region may be formed at the central semiconductor pillar as well as the first and second transistor active regions between the first and second top gate electrodes. A first source region may be formed at the first semiconductor pillar and the first transistor active region that is adjacent to the first top gate electrode and opposite the common drain region. A second source region may be formed at the second semiconductor pillar and the second transistor active region that is adjacent to the second top gate electrode and opposite the common drain region.

In yet other embodiments of the present invention, a double gate MOS transistor includes an isolation layer formed at a portion of a semiconductor substrate to define a substrate active region and a transistor active region disposed over the substrate active region and overlapped with the substrate active region. A first semiconductor pillar and a second semiconductor pillar are disposed at both sides of the transistor active region respectively. The first and second semiconductor pillars contact the substrate active region. A bottom gate electrode substantially fills a space between the transistor active region and the substrate active region, the bottom gate electrode being insulated from the substrate active region, the transistor active region, the first semiconductor pillar and the second semiconductor pillar. First and second parallel top gate electrodes cross over the transistor active region. Each of the first and second top gate electrodes have both ends that are in contact with sidewalls of the bottom gate electrode. The first and second top gate electrodes are located between the first and second semiconductor pillars to overlap with the bottom gate electrode.

Isolation impurity regions may also be formed at the substrate active region contacting the first and second semiconductor pillars. The isolation impurity regions have a different conductive type from the semiconductor substrate. A top surface of the isolation layer may be located at a same as or lower level than that of the substrate active region. A common drain region may be formed at the transistor active region between the first and second top gate electrodes. A first source region may be formed at the first semiconductor pillar and the transistor active region that is adjacent to the first top gate electrode and opposite the common drain region. A second source region may be formed at the second semiconductor pillar and the transistor active region that is adjacent to the second top gate electrode and opposite the common drain region.

In other embodiments of the present invention, methods of manufacturing a double gate MOS transistor include sequentially forming a first sacrificial layer, a semiconductor layer and a bottom hard mask layer on a semiconductor substrate. At least one semiconductor pillar is formed penetrating the bottom hard mask layer, the semiconductor layer and the first sacrificial layer to contact a portion of the semiconductor substrate. A top hard mask layer is formed on the semiconductor substrate having the semiconductor pillar. The top hard mask layer and the bottom hard mask layer are successively patterned to form a hard mask pattern that covers the semiconductor pillar. The semiconductor layer, the first sacrificial layer and the semiconductor substrate are successively etched using the hard mask pattern as an etching mask, thereby forming a first sacrificial layer pattern and a transistor active region that are sequentially stacked and in contact with the semiconductor pillar and simultaneously forming a trench region that defines an active region under the hard mask pattern. The first sacrificial layer pattern is removed to form an undercut region under the transistor active region. A second sacrificial layer pattern is formed substantially filling the undercut region. A recessed isolation layer is formed in the trench region to expose a sidewall of the second sacrificial layer pattern. The second sacrificial layer pattern and the hard mask pattern are selectively removed to form another undercut region under the transistor active region. A gate insulating layer is formed on a surface of the transistor active region, a top surface of the active region and a surface of the semiconductor pillar. A conductive layer substantially filling the other undercut region is formed on the semiconductor substrate having the gate insulating layer. The conductive layer is patterned to form at least one top gate electrode crossing over the transistor active region and overlapping with the other undercut region and to form a bottom gate electrode remaining in the other undercut region and contacting at least one end of the top gate electrode.

In further embodiments of the present invention, the first sacrificial layer is formed of a single crystalline semiconductor layer having an etching selectivity with respect to the semiconductor substrate and the semiconductor layer. The single crystalline semiconductor layer may be formed of a silicon germanium (SiGe) layer. The semiconductor layer may be formed of a single crystalline silicon layer. The bottom hard mask layer may be formed of a silicon nitride layer.

In additional embodiments of the present invention, forming the at least one semiconductor pillar includes successively patterning the bottom hard mask layer, the semiconductor layer and the first sacrificial layer to form a hole that exposes a portion of the semiconductor substrate and filling the hole with a semiconductor material using a selective epitaxial growth technique. Impurity ions having a different conductivity type from the semiconductor substrate may also be implanted into the exposed semiconductor substrate before filling the hole with the semiconductor material, thereby forming an isolation impurity region.

In certain embodiments of the present invention, the hole may be filled with the semiconductor material by growing a preliminary semiconductor pillar on the inner walls of the hole using a selective epitaxial growth technique, the preliminary semiconductor pillar being grown to not completely fill the hole, annealing the preliminary semiconductor pillar and then filling the hole with the semiconductor material using the selective epitaxial growth technique. The annealing may be performed using argon gas at a temperature of about 900° C. The annealing could also be performed using hydrogen gas at a temperature of from about 600° C. to 1000° C. The annealing may be performed using a laser.

In still further embodiments of the present invention, the semiconductor pillar is formed of the same material layer as the semiconductor layer. The top hard mask layer may be formed of the same material layer as the bottom hard mask layer. Additionally, forming the second sacrificial layer pattern may include forming a second sacrificial layer filling the undercut region on surface of the semiconductor substrate where the first sacrificial layer pattern was removed and etching the second sacrificial layer to expose inner walls of the trench region to leave the second sacrificial layer only in the undercut region. The second sacrificial layer may be formed of the same material layer as the hard mask pattern.

In additional embodiments of the present invention, impurity ions are implanted into the transistor active region using the top gate electrode as an ion implantation mask to form source/drain regions.

BRIEF DESCRIPTION OF THE DRAWINGS

FIGS. 2A to 10A are sectional views, taken along the line I—I of FIG. 1, to illustrate methods of manufacturing double gate MOS transistors according to embodiments of the present invention;

FIGS. 2B to 10B are sectional views, taken along the line II—II of FIG. 1, to illustrate methods of manufacturing double gate MOS transistors according to embodiments of the present invention;

DETAILED DESCRIPTION OF EXEMPLARY EMBODIMENTS

Figure 1:
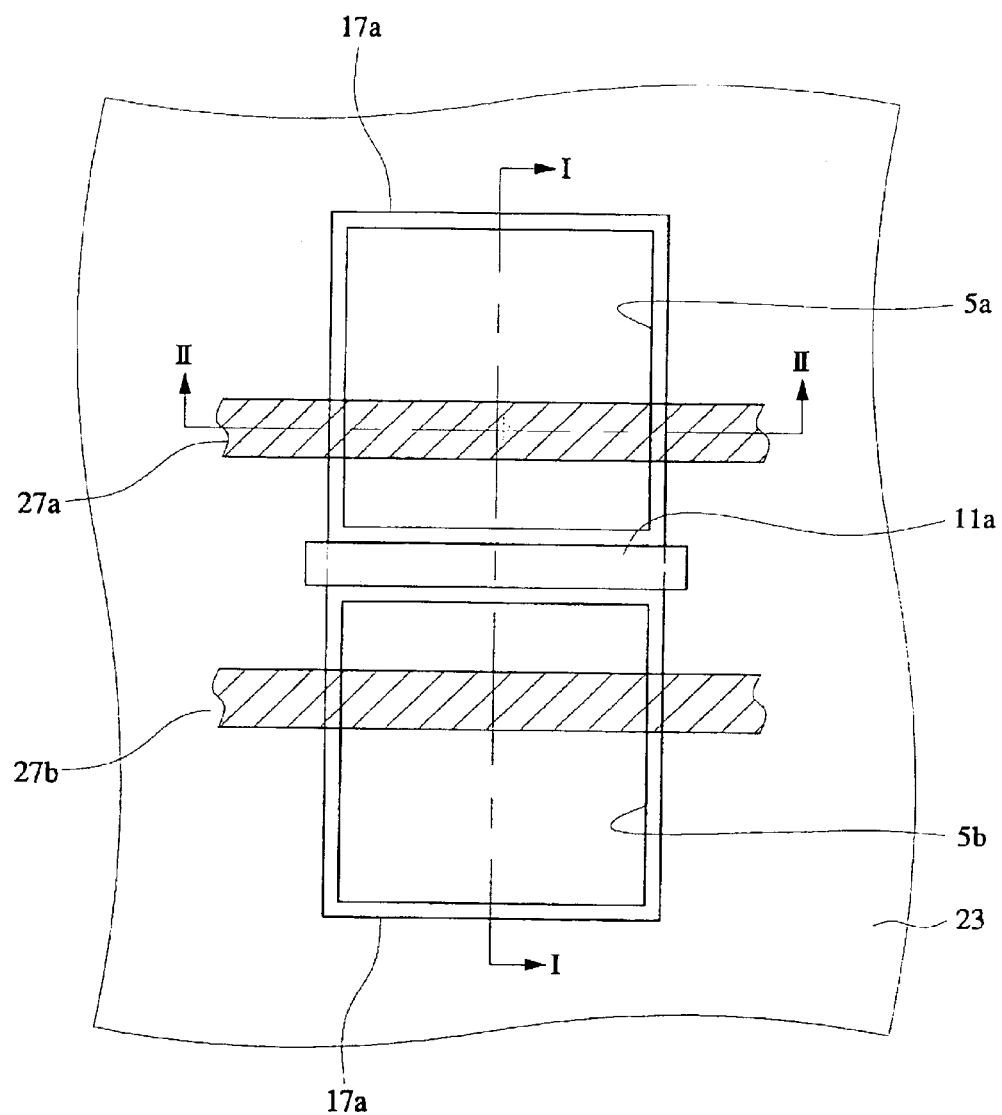
FIG. 1 is a top plan view illustrating a double gate MOS transistor according to embodiments of the present invention.

The present invention will now be described more fully hereinafter with reference to the accompanying drawings, in which embodiments of the invention are shown. This invention may, however, be embodied in different forms and should not be construed as limited to the embodiments set forth herein. Rather, theses embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 10A:
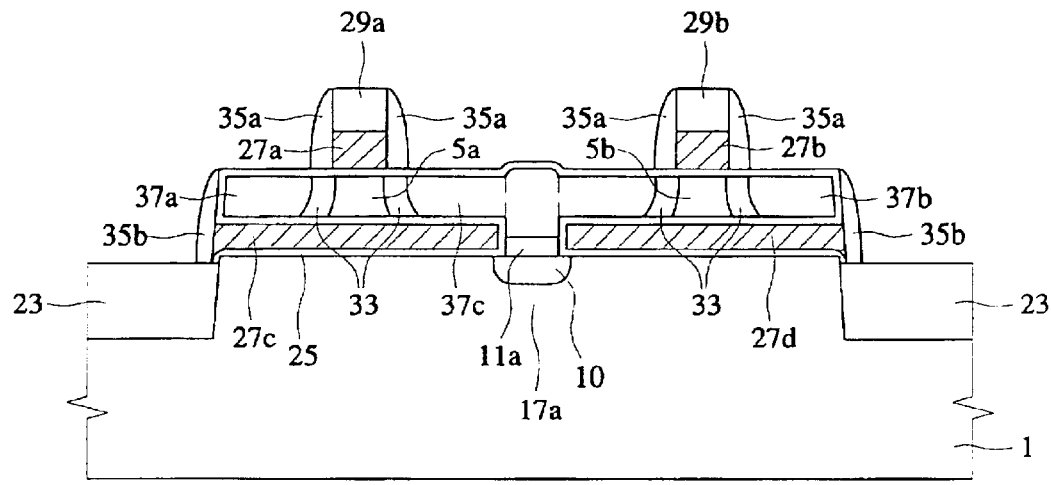
Figure 10B:
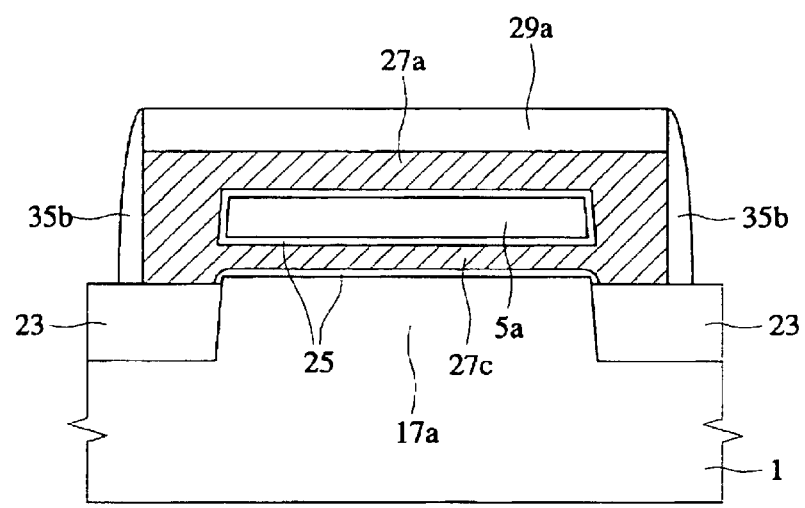

FIG. 1 is a top plan view illustrating double gate MOS transistors according to embodiments of the present invention, and FIGS. 10A and 10B are sectional views taken along the lines I—I and II—II of FIG. 1 respectively.

Referring to FIGS. 1, 10A and 10B, an isolation layer 23 is formed at a predetermined region of a semiconductor substrate 1, such as a silicon substrate. The isolation layer 23 defines an active region 17a. Preferably, the top surface of the isolation layer 23 is located at the same level as a top surface of the active region 17a or is lower than that of the active region 17a. A transistor active region is disposed over the active region 17a. The transistor active region overlaps with the active region 17a. The transistor active region is composed of a semiconductor layer such as a silicon layer. At least one semiconductor pillar penetrates a predetermined region of the transistor active region. For example, the semiconductor pillar may be a single horizontal bar-shaped semiconductor pillar 11a, e.g., a central semiconductor pillar that intersects the transistor active region, as shown in FIGS. 1 and 10a. Thus, the transistor active region is divided into a first transistor active region 5a, and a second transistor active region 5b by the central semiconductor pillar 11a.

The central semiconductor pillar 11a may be a semiconductor layer such as a silicon layer. The central semiconductor pillar 11*a* contacts a surface of the active region 17*a*. In addition, the central semiconductor pillar 11*a* supports the first and second transistor active regions 5*a* and 5*b* so that the first and second transistor active regions 5*a* and 5*b* are spaced apart from the active region 17*a*. Accordingly, there exist empty spaces, e.g., undercut regions between the transistor active regions 5*a* and 5*b* and the active region 17*a*. In detail, there exists a first undercut region between the first transistor active region 5*a* and the active region 17*a*, and there exists a second undercut region between the second transistor active region 5*b* and the active region 17*a*. The first and second undercut regions are filled with a first bottom gate electrode 27*c* and a second bottom gate electrode 27*d* respectively.

A gate insulating layer 25 is interposed between the bottom gate electrodes 27*c* and 27*d* and the transistor active regions 5*a* and 5*b*. Also, the gate insulating layer 25 is interposed between the bottom gate electrodes 27*c* and 27*d* and the semiconductor pillar 11*a*. In addition, the gate insulating layer 25 is interposed between the bottom gate electrodes 27*c* and 27*d* and the active region 17*a*. As a result, the bottom gate electrodes 27*c* and 27*d* are insulated from the transistor active regions 5*a* and 5*b*, the semiconductor pillar 11*a* and the active region 17*a* by the gate insulating layer 25.

A first top gate electrode 27*a* and a second top gate electrode 27*b* are disposed over the first and second transistor active regions 5*a* and 5*b* respectively. Both ends of the first top gate electrode 27*a* contact sidewalls of the first bottom gate electrode 27*c* as shown in FIG. 10B. As a result, the first top gate electrode 27*a* is electrically connected to the first bottom gate electrode 27*c*. Similarly, both ends of the second top gate electrode 27*b* contact sidewalls of the second bottom gate electrode 27*d*. As a result, the second top gate electrode 27*b* is electrically connected to the second bottom gate electrode 27*d*. Also, the gate insulating layer 25 is interposed between the top gate electrodes 27*a* and 27*b* and the transistor active regions 5*a* and 5*b*.

Sidewalls of the top gate electrodes 27*a* and 27*b* are covered with a first gate spacer 35*a*. In addition, sidewalls of the bottom gate electrodes 27*c* and 27*d* are covered with a second gate spacer 35*b*. The first and second gate spacers 35*a* and 35*b* may be insulating layers. A first capping layer pattern 29*a* and a second capping layer pattern 29*b* may be provided on the first and second top gate electrodes 27*a* and 27*b* respectively.

Further, LDD regions 33 are formed in the transistor active regions 5*a* and 5*b* under the first gate spacers 35*a*. The LDD regions 33 define channel regions located under the top gate electrodes 27*a* and 27*b*. High concentration source/drain regions 37*a*, 37*b* and 37*c* are formed opposite the channel regions, being adjacent to the LDD regions 33. As a result, a first double gate MOS transistor is formed at the first transistor active region 5*a*, and a second double gate MOS transistor is formed at the second transistor active region 5*b*.

The first and second double gate MOS transistors according to the above embodiments may be used as DRAM cell transistors. In this case, the high concentration source/drain regions 37*c* formed between the first and second top gate electrodes 27*a* and 27*b* may correspond to a common drain region, and the high concentration source/drain regions 37*a* and 37*b* may correspond to first and second source regions respectively.

Furthermore, an isolation impurity region 10 may be formed at the surface of the active region 17*a* contacting the central semiconductor pillar 11*a*. The isolation impurity region 10 is formed to have a different conductive type from the semiconductor substrate 1, e.g., the active region 17*a*. For example, if the semiconductor substrate 1 is P-type, the isolation impurity region 10 is N-type. That is, a PN junction is formed under the semiconductor pillar 11*a*. Accordingly, even with the presence of crystalline defects in the semiconductor pillar 11*a* and the application of a positive voltage to the common drain region, leakage current that flows through the semiconductor pillar 11*a* and the semiconductor substrate 1 may be reduced and/or minimized.

Methods of manufacturing double gate MOS transistors according to embodiments of the present invention will now be described with reference to FIGS. 2A to 10A and FIGS. 2B to 10B. FIGS. 2A to 10A are sectional views taken along the line I—I of FIG. 1, and FIGS. 2B to 10B are sectional views taken along the line II—II of FIG. 1.

Figure 2A:
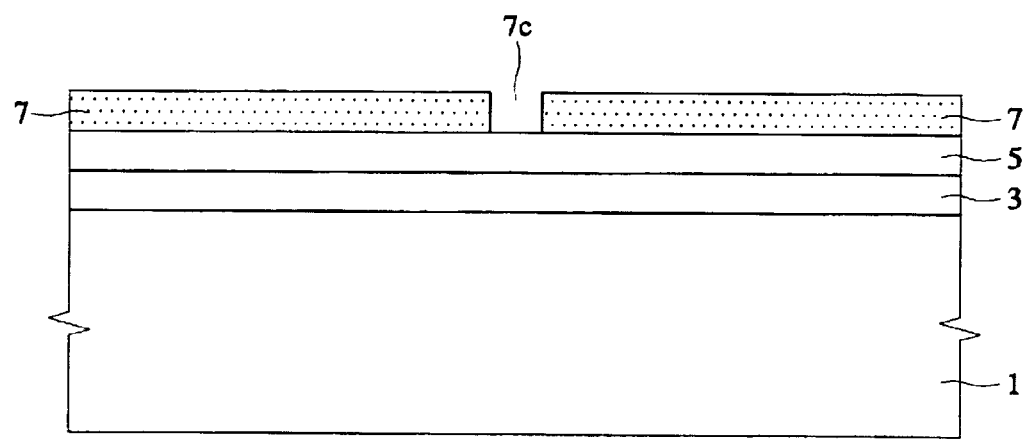
Figure 2B:
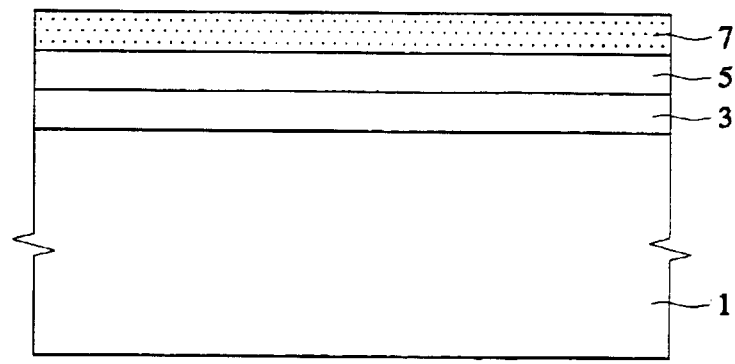

Referring to FIGS. 2A and 2B, a first sacrificial layer 3, a semiconductor layer 5, and a bottom hard mask layer 7 are sequentially formed on a semiconductor substrate 1 such as a single crystalline silicon substrate. In certain embodiments, the semiconductor layer 5 may be formed of the same material layer as the semiconductor substrate 1. For example, if the semiconductor substrate 1 is a silicon substrate, the semiconductor layer 5 may be formed of a silicon layer. In particular embodiments, the semiconductor layer 5 is formed of a single crystalline silicon layer using an epitaxial growth technique. The first sacrificial layer 3 may be formed of a material layer having an etching selectivity with respect to the semiconductor substrate 1, the semiconductor layer 5 and the bottom hard mask layer 7. In addition, the first sacrificial layer 3 may be formed of a material layer that acts as a seed layer during the growth of the semiconductor layer 5. For example, the first sacrificial layer 3 may be formed of a single crystalline silicon germanium (SiGe) layer. Also, the bottom hard mask layer 7 may be formed of a material layer having an etching selectivity with respect to the first sacrificial layer 3 and the semiconductor layer 5. For example, the bottom hard mask layer 7 may be formed of a silicon nitride layer. The bottom hard mask layer 7 is patterned to form at least one opening 7*c* exposing a predetermined region of the semiconductor layer 5. In the illustrated embodiment, the opening 7*c* is formed to have a horizontal bar configuration when viewed from a top plan view.

Figure 3A:
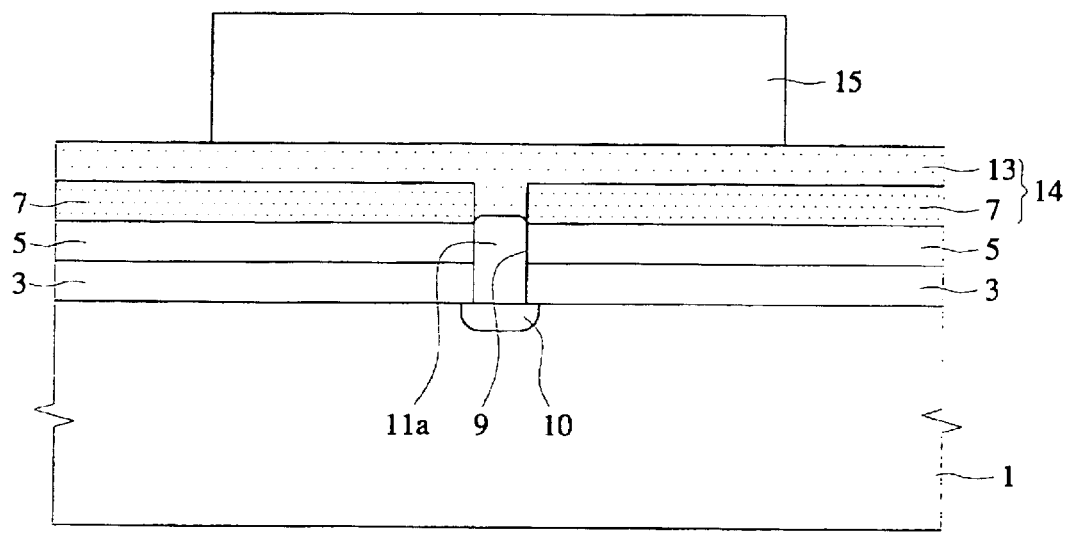
Figure 3B:
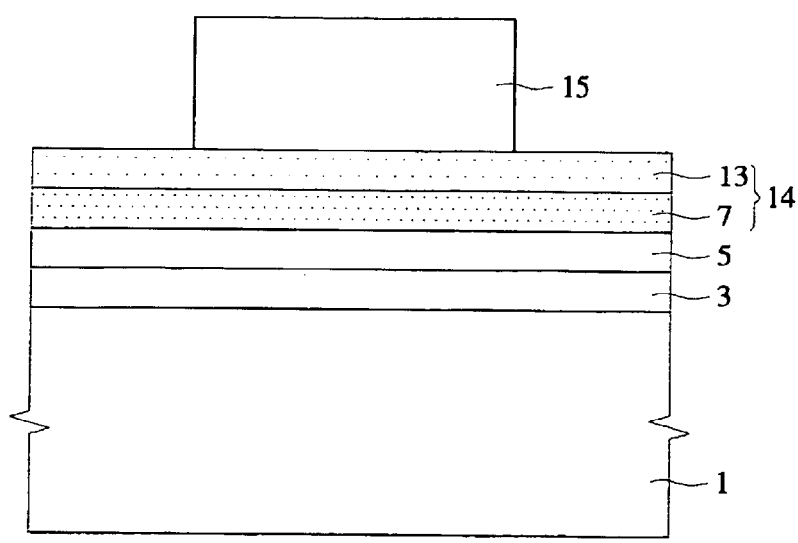

Referring to FIGS. 3A and 3B, the semiconductor layer 5 and the first sacrificial layer 3 are etched using the patterned bottom hard mask layer 7 as an etching mask, thereby forming a hole 9 that exposes a predetermined region of the semiconductor substrate 1. The hole 9 has the same configuration as the opening 7*c*. That is, the hole 9 also has a horizontal bar configuration.

A semiconductor pillar 11*a* is selectively formed inside the hole 9. Accordingly, the semiconductor pillar 11*a* is also formed to have a horizontal bar configuration as shown in FIG. 1. The semiconductor pillar 11*a* may be formed of the same material layer as the semiconductor layer 5. That is, the semiconductor pillar 11*a* may be formed of a silicon layer. The semiconductor pillar 11*a* may be formed using a selective epitaxial growth method.

Prior to formation of the semiconductor pillar 11*a*, impurity ions may be implanted into the exposed semiconductor substrate 1 to form an isolation impurity region 10. The impurity ions have a conductivity type different from the semiconductor substrate 1. Accordingly, if the semiconductor substrate 1 is P-type, the isolation impurity region 10 is N-type. As a result, a PN junction is formed under the hole 9. Since the PN junction is formed in the single crystalline semiconductor substrate 1, leakage current characteristics of the PN junction may be improved under a reverse bias. Accordingly, even though crystalline defects exist in the semiconductor pillar 11a, leakage current characteristics of impurity regions to be formed in the semiconductor pillar 11a and the semiconductor layer 5 in subsequent processes may be improved.

In the event that the semiconductor pillar 11a filling the hole 9 is formed using the selective epitaxial growth method, discontinuous regions may be formed in the semiconductor pillar 11a from the viewpoint of crystalline orientation. This is because the growth orientation of the single crystalline silicon layer formed on sidewalls of the semiconductor layer 5 is different from the growth orientation of the single crystalline silicon layer formed on a surface of the semiconductor substrate 1. As a result, grain boundaries are formed in the semiconductor pillar 11a, and the grain boundaries generate crystalline defects. The crystalline defects in the semiconductor pillar 11a may lead to a degradation of the electric characteristics (for example, leakage current characteristics) of the double gate MOS transistor according to embodiments of the present invention. Therefore, in certain embodiments of the present invention, the semiconductor pillar 11a is formed using methods, that is capable of suppressing the generation of the crystalline defects.

Figure 11:
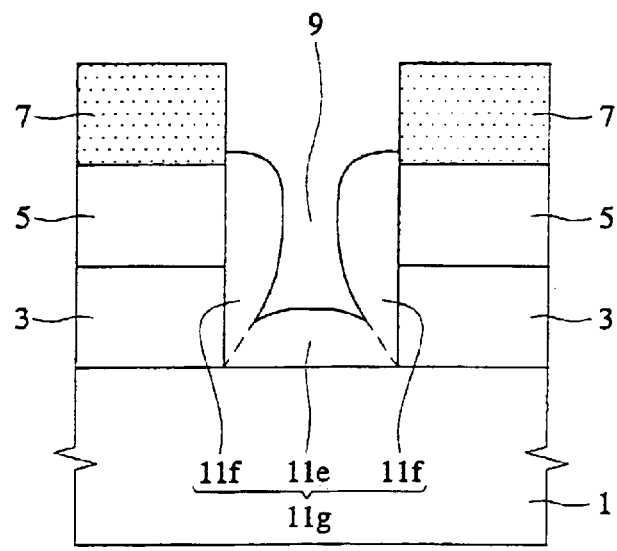
FIGS. 11 to 13 are sectional views to illustrate methods of forming a semiconductor pillar shown in FIG. 3A in detail.
Figure 12:
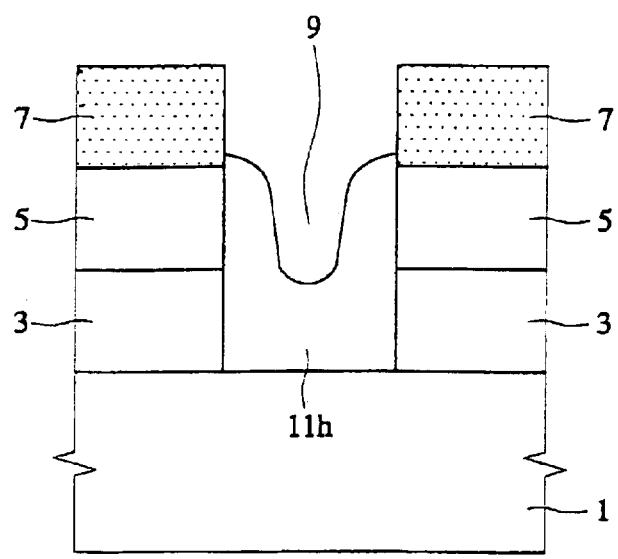
Figure 13:
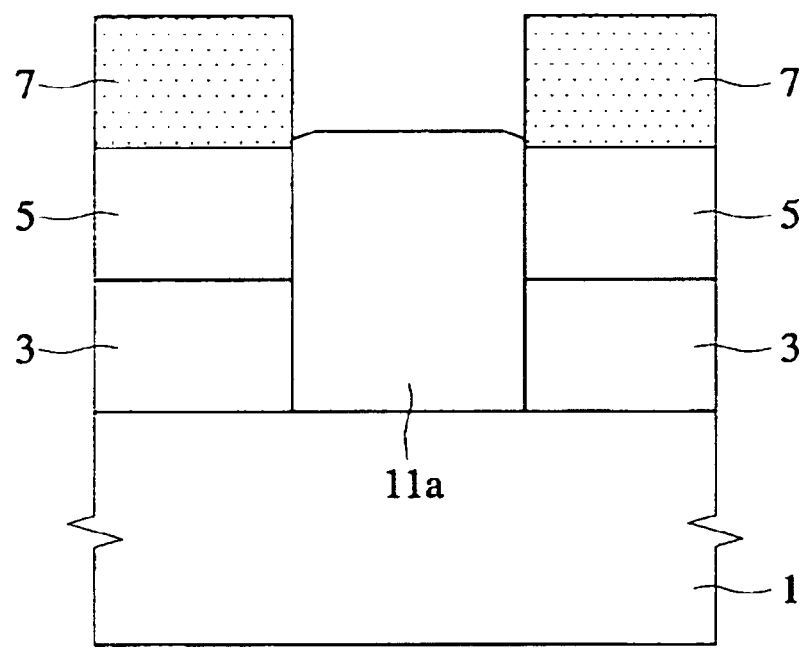

FIGS. 11 to 13 are sectional views to illustrate methods for preventing the generation of the crystalline defects.

Referring to FIG. 11, a first preliminary semiconductor pillar 11g is formed on the sidewalls and the bottom surface of the hole 9 using the aforementioned selective epitaxial growth method. In this case, the first preliminary semiconductor pillar 11g is formed not to fill the hole 9 completely as shown in FIG. 11. The first preliminary semiconductor pillar 11g includes a first semiconductor layer 11e grown on the semiconductor substrate 1 and a second semiconductor layer 11f grown on the sidewalls of the semiconductor layer 5. Accordingly, grain boundaries are formed between the first and second semiconductor layers 11e and 11f.

Referring to FIG. 12, the substrate having the first preliminary semiconductor pillar 11g is annealed to cure the crystalline defects in the first preliminary semiconductor pillar 11g and to form a second preliminary semiconductor pillar 11h in the hole 9. The annealing process may be, for example, performed using argon gas, hydrogen gas or laser. As a result, the second preliminary semiconductor pillar 11h has a low aspect ratio as compared to the first preliminary semiconductor pillar 11g as shown in FIG. 12. In addition, the second preliminary semiconductor pillar 11h does not have any grain boundary therein. That is, the second preliminary semiconductor pillar 11h has a unique crystalline orientation. In the event that the annealing process is performed using argon gas, the annealing process may be performed at a temperature of about 900° C. Also, in the event that the annealing process is performed using hydrogen gas, the annealing process may be performed at a temperature of from about 600° C. to 1000° C.

Referring to FIG. 13, another semiconductor layer is additionally grown on the second preliminary semiconductor pillar 11h using the selective epitaxial growth technique again. As a result, a semiconductor pillar 11a completely filling the hole 9 is formed.

Referring to FIGS. 3A and 3B again, a top hard mask layer 13 is formed on a surface of the semiconductor substrate having the semiconductor pillar 11a. The top hard mask layer 13 may be formed of the same material layer as the bottom hard mask layer 7. The bottom hard mask layer 7 and the top hard mask layer 13 constitute a hard mask layer 14. A first photoresist pattern 15 is formed on a predetermined region of the hard mask layer 14. The first photoresist pattern 15 is formed to cross over the semiconductor pillar 11a.

Figure 4A:
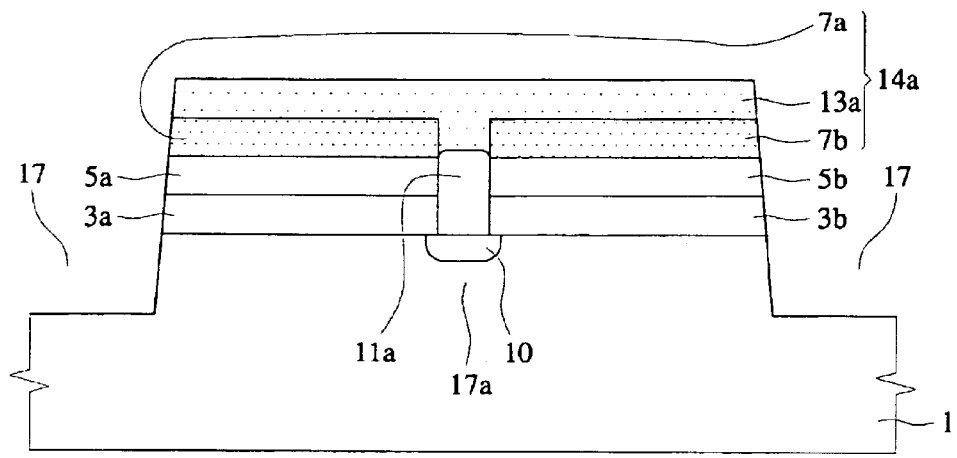
Figure 4B:
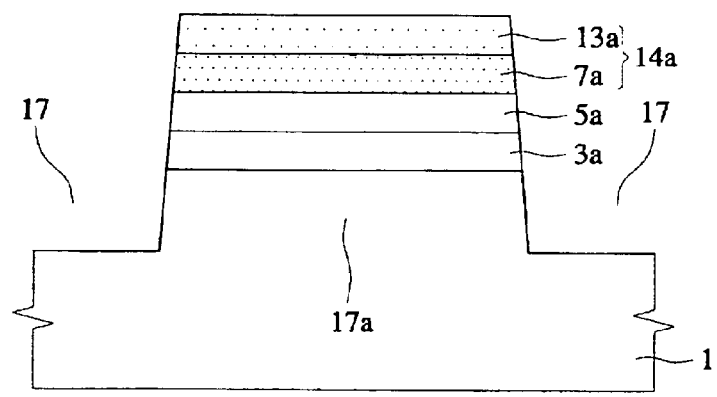

Referring to FIGS. 4A, and 4B, the hard mask layer 14 is etched using the first photoresist pattern 15 as an etching mask, thereby forming a hard mask pattern 14a that covers the semiconductor pillar 11a. As a result, the hard mask pattern 14a includes a top hard mask pattern 13a as well as a first bottom hard mask pattern 7a and a second bottom hard mask pattern 7b. The first and second bottom hard mask patterns 7a and 7b are formed so that they are located at both sides of the semiconductor pillar 11a. The first photoresist pattern 15 is then removed.

The semiconductor layer 5, the first sacrificial layer 3 and the semiconductor substrate 1 are successively etched using the hard mask pattern 14a as an etching mask, thereby forming a trench region 17 in the semiconductor substrate 1. The trench region 17 defines an active region 17a under the hard mask pattern 14a. Accordingly, a sacrificial layer pattern 3a and a first transistor active region 5a sequentially stacked are formed between the active region 17a and the first bottom hard mask pattern 7a, and a sacrificial layer pattern 3b and a second transistor active region 5b sequentially stacked are formed between the active region 17a and the second bottom hard mask pattern 7b. The sacrificial layer patterns 3a and 3b are separated from each other by the semiconductor pillar 11a. The first and second transistor active regions 5a, 5b are also separated from each other by the semiconductor pillar 11a.

Figure 5A:
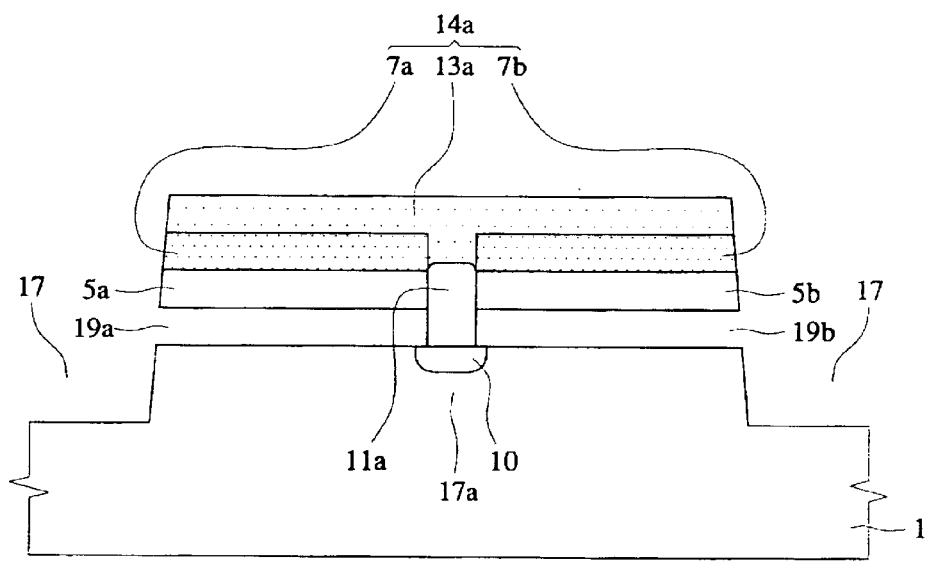
Figure 5B:
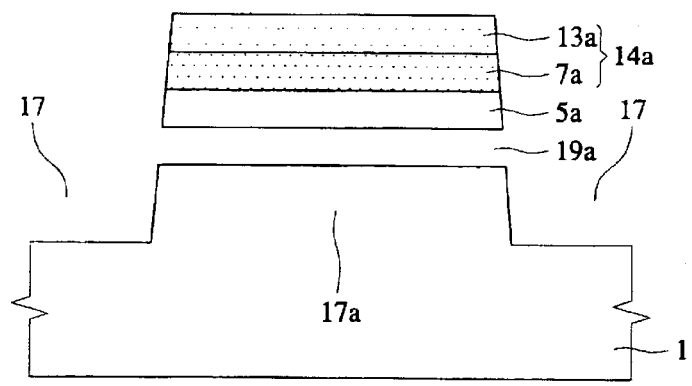

Referring to FIGS. 5A and 5B, the sacrificial layer patterns 3a and 3b are selectively removed to form a first undercut region 19a and a second undercut region 19b under the first and second transistor active regions 5a and 5b respectively. In the event that the sacrificial layer patterns 3a and 3b are formed of a silicon germanium (SiGe) layer, the sacrificial layer patterns 3a and 3b may be selectively removed using a mixture of nitric acid ($HNO_3$), hydrofluoric acid (HF) and de-ionized water. The mixture may further contain acetic acid ($CH_3COOH$).

Figure 6A:
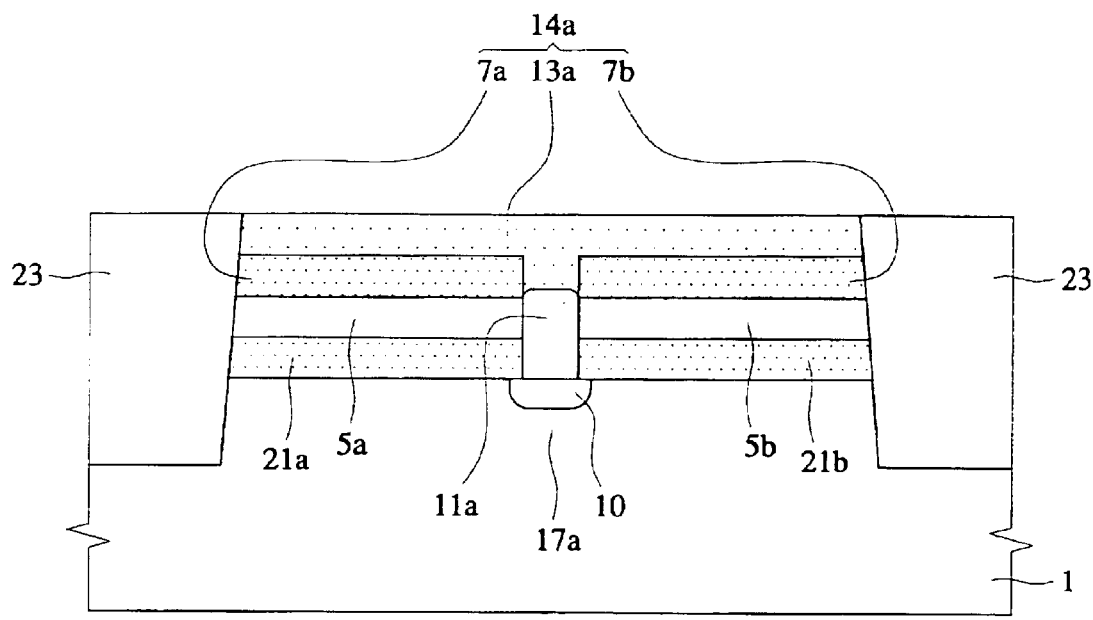
Figure 6B:
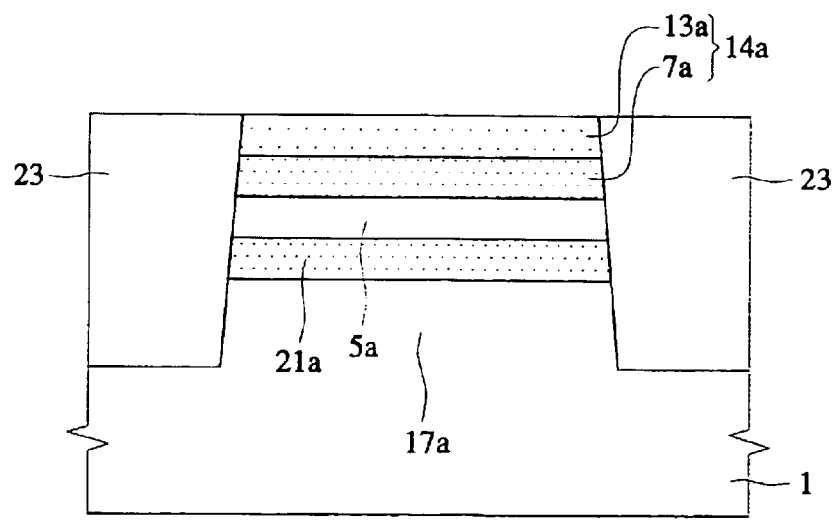

Referring to FIGS. 6A and 6B, a second sacrificial layer is formed on a surface of the semiconductor substrate to fill the undercut regions 19a and 19b. Accordingly, sidewalls and bottom surfaces of the trench region 17 are covered with the second sacrificial layer. The second sacrificial layer may be formed of a material layer having an etching selectivity with respect to the transistor active regions 5a and 5b, the semiconductor substrate 1, and the semiconductor pillar 11a. For example, the second sacrificial layer may be formed of a silicon nitride layer. The second sacrificial layer is etched to expose the sidewalls and the bottom surfaces of the trench region 17. As a result, sacrificial layer patterns 21a and 21b remain in the first and second undercut regions 19a and 19b respectively. The etching process of the second sacrificial layer may be performed using phosphoric acid ($H_3PO_4$). An isolation layer 23 is formed in the trench region 17 using a conventional manner. The isolation layer 23 may be formed of an insulating layer such as a silicon oxide layer.

Figure 7A:
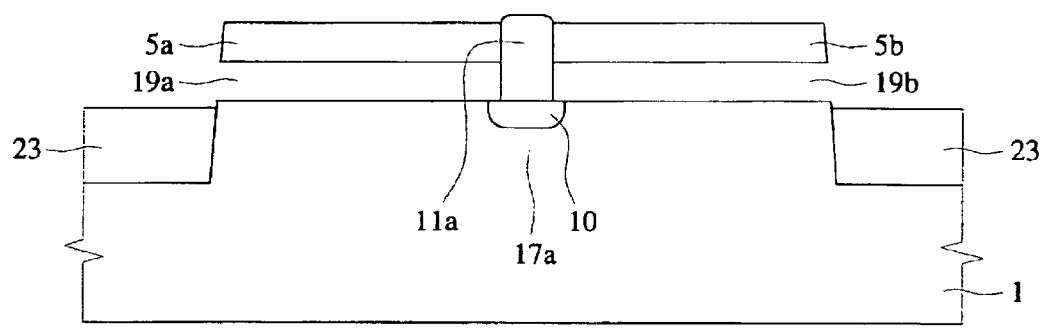
Figure 7B:
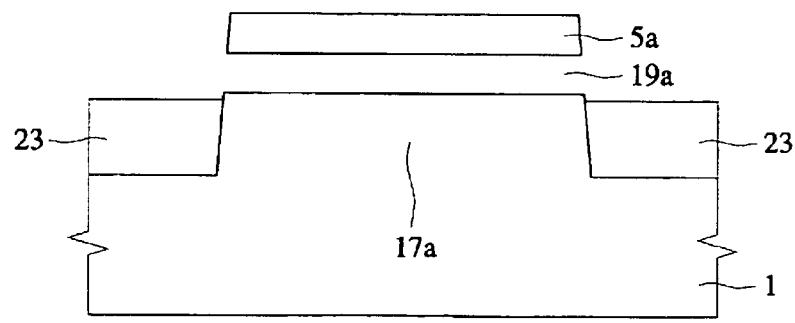

Referring to FIGS. 7A and 7B, the isolation layer 23 is recessed until the sidewalls of the sacrificial layer patterns 21a and 21b are exposed. The hard mask pattern 14a and the sacrificial layer patterns 21a and 21b are selectively removed so as to expose surfaces of the transistor active regions 5a and 5b, a surface of the semiconductor pillar 11a, and a surface of the active region 17a. Accordingly, the first and second undercut regions 19a and 19b are formed again under the first and second transistor active regions 5a and 5b respectively.

Figure 8A:
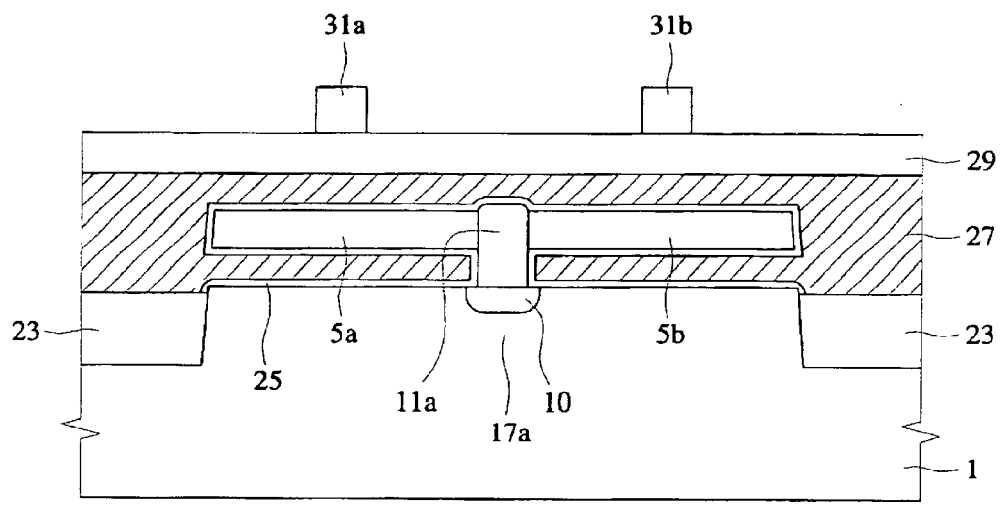
Figure 8B:
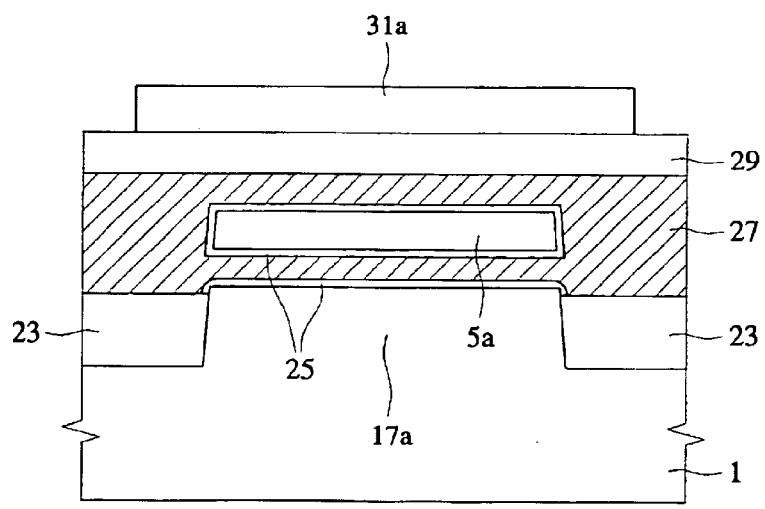

Referring to FIGS. 8A and 8B, a gate insulating layer 25 is formed on the surfaces of the transistor active regions 5a and 5b, the surface of the semiconductor pillar 11a, and the surface of the active region 17a. The gate insulating layer 25 may be formed by thermally oxidizing the semiconductor substrate where the hard mask pattern 14a and the sacrificial layer patterns 21a and 21b are removed. A gate conductive layer 27 is then formed on a surface of the semiconductor substrate having the gate insulating layer 25. The gate conductive layer 27 may be formed using a deposition technique that provides good step coverage. For example, the gate conductive layer 27 may be formed using a low pressure chemical vapor deposition (LPCVD) technique. Accordingly, the undercut regions 19a and 19b may be completely filled with the gate conductive layer 27. The gate conductive layer 27 may be formed of a doped polysilicon layer.

Second photoresist patterns 31a and 31b are formed on the gate conductive layer 27. The second photoresist patterns 31a and 31b are formed to cross over the first and second transistor active regions 5a and 5b respectively. A gate hard mask layer 29 may be formed on the gate conductive layer 27 prior to formation of the second photoresist patterns 31a and 31b. In certain embodiments, the gate hard mask layer 29 is formed of a CVD oxide layer.

Figure 9A:
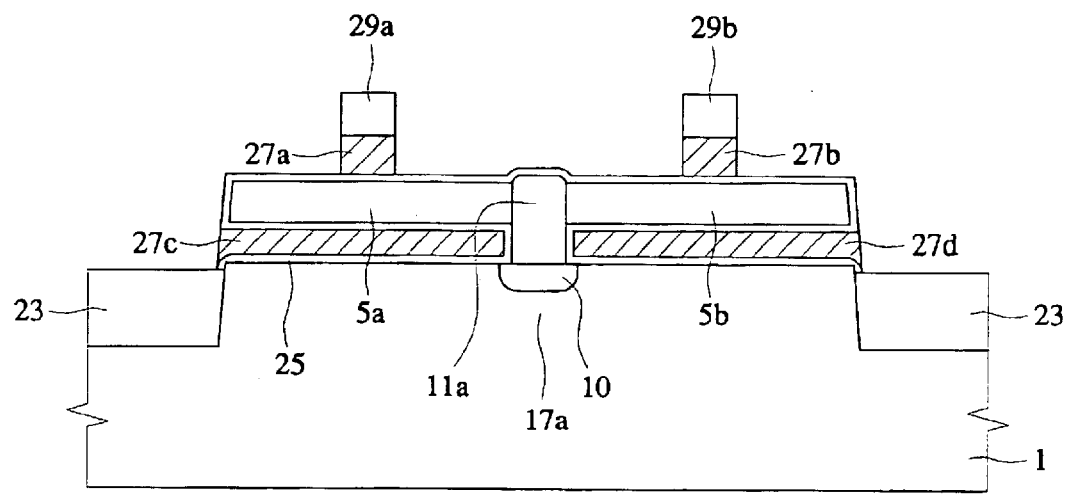
Figure 9B:
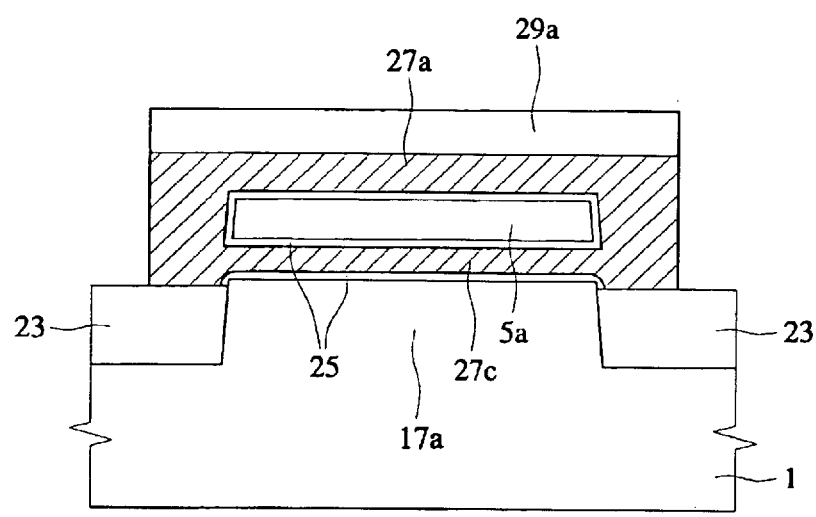

Referring to FIGS. 9A and 9B, the gate hard mask layer 29 is etched using the second photoresist patterns 31a and 31b as etching masks, thereby forming a first gate hard mask pattern 29a and a second gate hard mask pattern 29b that cross over the first and second transistor active regions 5a and 5b respectively. The second photoresist patterns 31a, 31b are then removed. The gate conductive layer 27 is etched using the first and second gate hard mask patterns 29a and 29b as etching masks, thereby forming gate electrodes.

The gate electrodes include a first top gate electrode 27a and a second top gate electrode 27b that cross over the first and second transistor active regions 5a and 5b respectively. In addition, the gate electrodes further include a first bottom gate electrode 27c and a second bottom gate electrode 27d that remain in the first and second undercut regions 19a and 19b respectively. Accordingly, both ends of the first top gate electrode 27a contact sidewalls of the first bottom gate electrode 27c as shown in FIG. 9B. Similarly, both ends of the second top gate electrode 27b contact sidewalls of the second bottom gate electrode 27d.

Referring to FIGS. 10A and 10B, first gate spacers 35a, second gate spacers 35b and source/drain regions are formed at the semiconductor substrate having the first and second top gate electrodes 27a and 27b using conventional techniques. The source/drain regions include a common drain region 37c formed between the first and second top gate electrodes 27a and 27b, a first source region 37a located adjacent to the first gate electrode 27a and opposite the common drain region 37c, and a second source region 37b located adjacent to the second gate electrode 27b and opposite the common drain region 37c. Further, LDD regions 33 having an impurity concentration lower than the source/drain regions 37a, 37b and 37c may be formed under the first gate spacers 35a.

Figure 14:
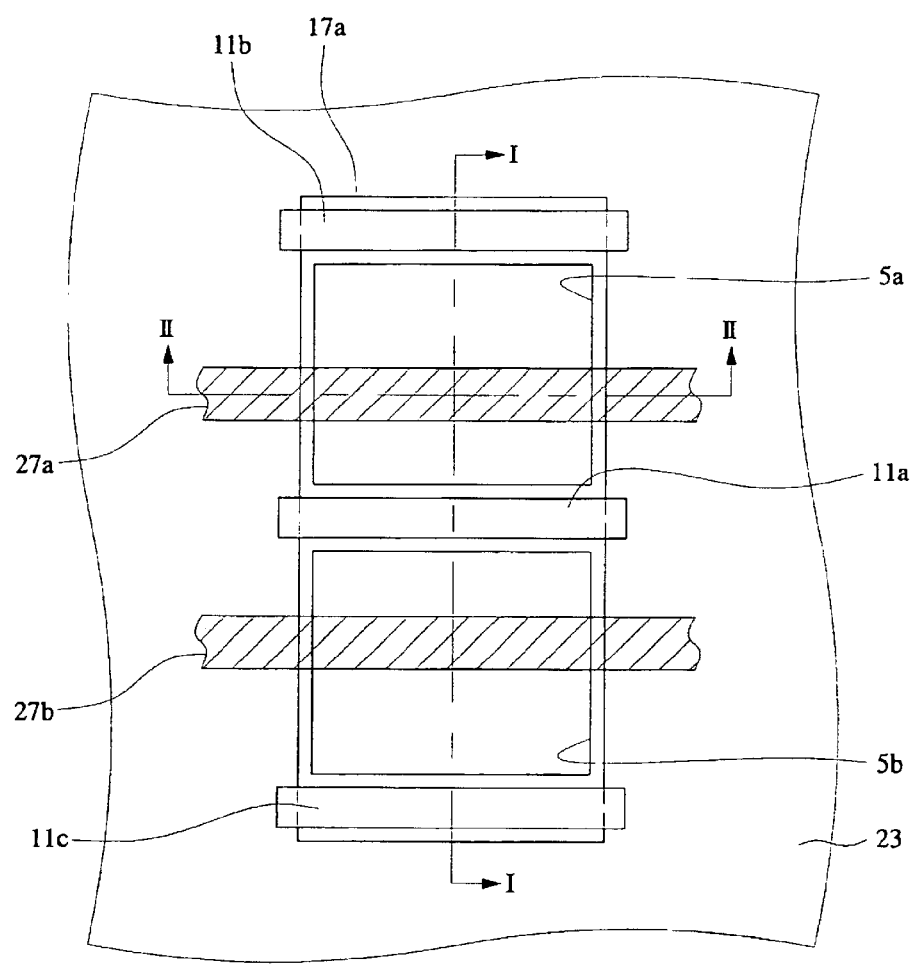
FIG. 14 is a top plan view illustrating double gate MOS transistors according to additional embodiments of the present invention.
Figure 15:
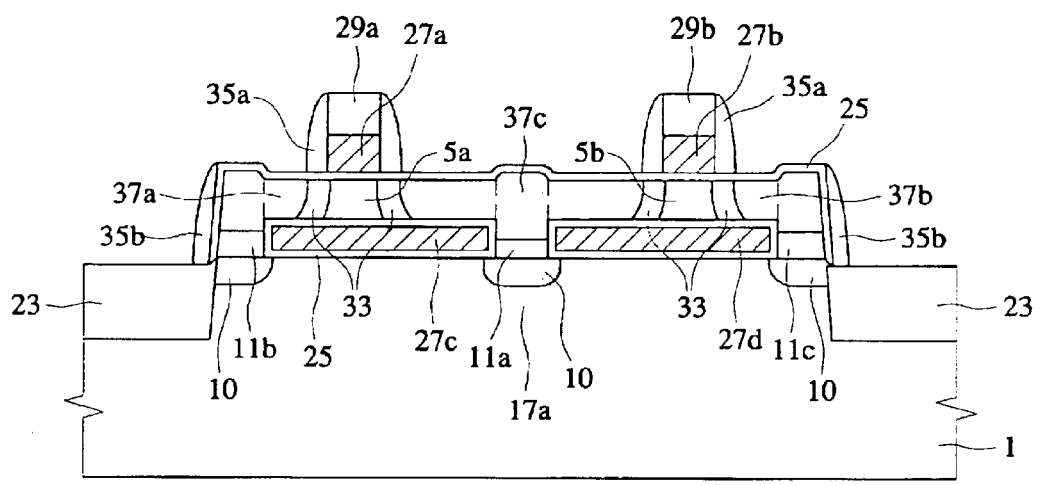
FIG. 15 is a sectional view taken along the line I—I of FIG. 14.

FIG. 14 is a top plan view illustrating a double gate MOS transistor according to further embodiments of the present invention, and FIG. 15 is a sectional view taken along the line I—I of FIG. 14. Here, the sectional view taken along the line II—II of FIG. 14 has the same structure as that of FIG. 10B. The embodiments illustrated in FIG. 14 are different from the embodiments illustrated in FIG. 1 in the number of the semiconductor pillars and their locations. Therefore, the description related to the semiconductor pillars is provided.

Referring to FIGS. 14 and 15, at least one semiconductor pillar according to this embodiment includes a first semiconductor pillar 11b and a second semiconductor pillar 11c as well as the central semiconductor pillar 11a described above. The first and second semiconductor pillars 11b and 11c are located on both edges of the active region 17a respectively. The first and second semiconductor pillars 11b and 11c are disposed in parallel to the central semiconductor pillar 11a as shown in FIG. 14. Accordingly, the first bottom gate electrode 27c and the first transistor active region 5a are sequentially stacked between the first semiconductor pillar 11b and the central semiconductor pillar 11a. Similarly, the second bottom gate electrode 27d and the second transistor active region 5b are sequentially stacked between the second semiconductor pillar 11c and the central semiconductor pillar 11a.

The double gate MOS transistor according to the embodiments of FIGS. 14 and 15 may be fabricated using the same methods as described above. Therefore, a description on the methods of manufacturing the double gate MOS transistor shown in FIGS. 14 and 15 will be omitted.

Figure 16:
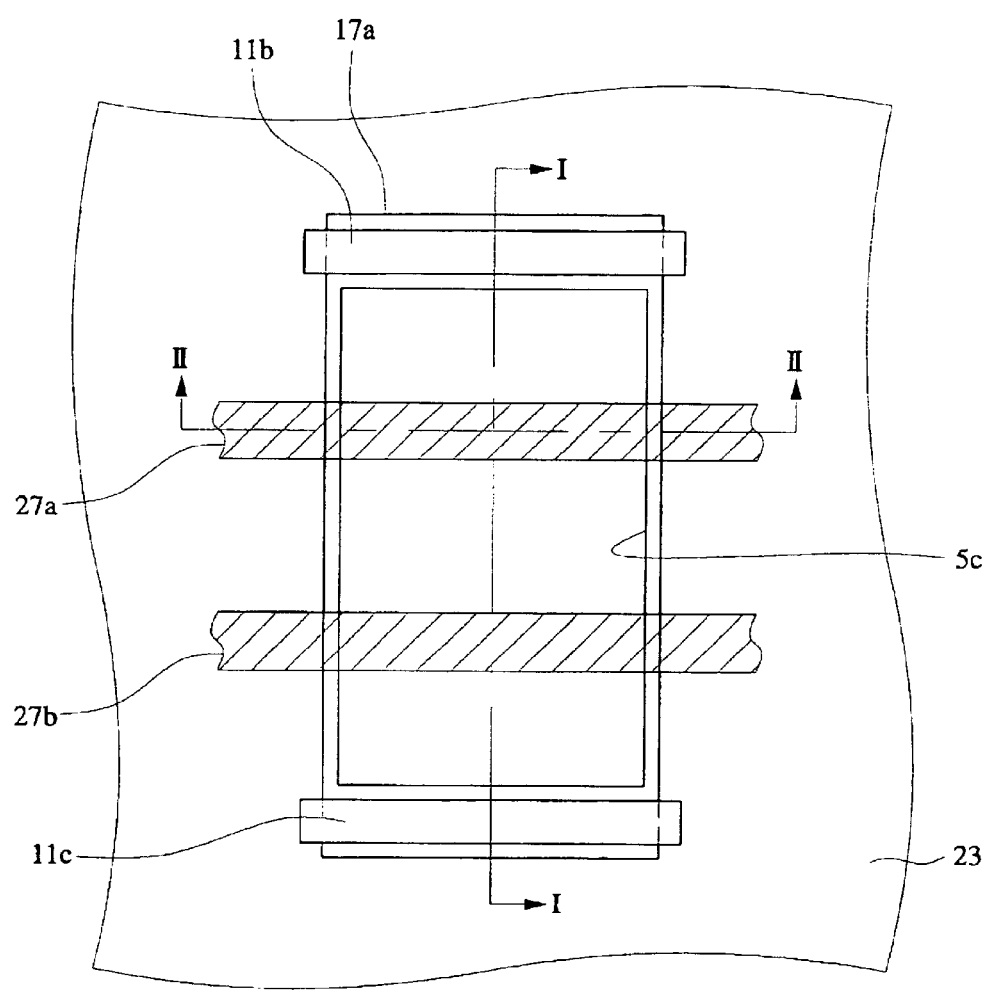
FIG. 16 is a top plan view illustrating double gate MOS transistors according to still further embodiments of the present invention.
Figure 17:
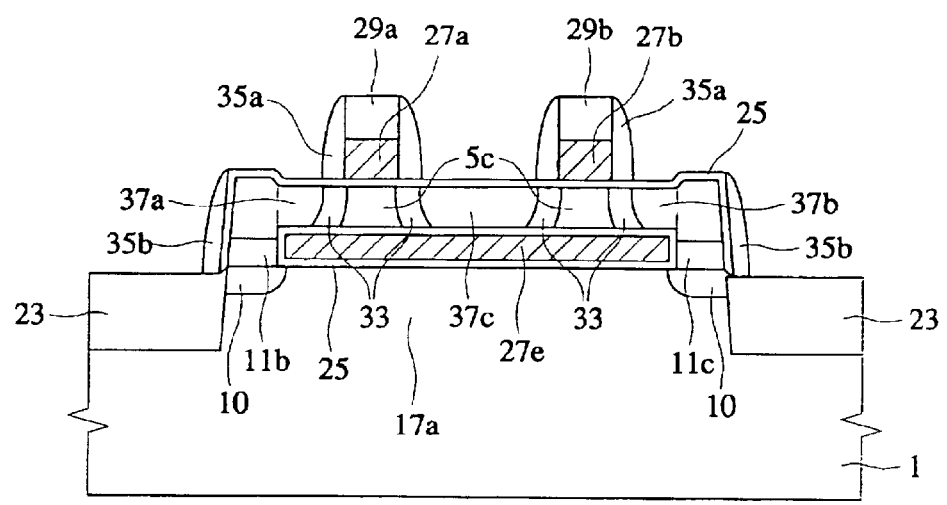
FIG. 17 is a sectional view taken along the line I—I of FIG. 16.

FIG. 16 is a top plan view illustrating a double gate MOS transistor according to further embodiments of the present invention, and FIG. 17 is a sectional view taken along the line I—I of FIG. 16. Here, the sectional view taken along the line II—II of FIG. 16 has the same structure as FIG. 10B. The embodiments of FIG. 16 are also different from the embodiments of FIG. 14 in the number of the semiconductor pillars and their locations only. Therefore, in these embodiments, only the description related to the semiconductor pillars will be provided.

Referring to FIGS. 16 and 17, at least one semiconductor pillar according to the third embodiment includes only the first and second semiconductor pillars 11b and 11c. Accordingly, a single bottom gate electrode 27e and a single transistor active region 5c are sequentially stacked between the first and second semiconductor pillars 11b and 11c. As a result, the first and second top gate electrodes 27a and 27b located over the single transistor active region 5c are electrically connected to each other through the single bottom gate electrode 27e.

The double gate MOS transistor of the embodiments of FIGS. 16 and 17 can be manufactured using the same methods as described above. Therefore, a description on the methods of manufacturing the double gate MOS transistor according to the embodiments of FIGS. 16 and 17 will be omitted.

As described above, according to embodiments of the present invention, a double gate MOS transistors may be fabricated without use of a silicon on insulator (SOI) substrate. In particular, the bottom gates may be electrically connected to the top gates without use of complicated processes.

While the present invention has been particularly shown and described with reference to exemplary embodiments thereof, it will be understood by those skilled in the art that the foregoing and other changes in form and details may be made therein without departing from the spirit and scope of the present invention.

What is claimed is:

1. A double gate MOS transistor comprising:
   a substrate active region defined in a semiconductor substrate;
   a transistor active region located over the substrate active region and overlapped with the substrate active region;
   at least one semiconductor pillar penetrating the transistor active region and being in contact with the substrate active region, the at least one semiconductor pillar supporting the transistor active region so that the transistor active region is spaced apart from the substrate active region;
   at least one bottom gate electrode substantially filling a space between the transistor active region and the substrate active region, the at least one bottom gate electrode being insulated from the substrate active region, the transistor active region and the semiconductor pillar; and
   at least one top gate electrode crossing over the transistor active region, and having at least one end that is in contact with a sidewall of the at least one bottom gate electrode, the at least one top gate electrode overlapping with the bottom gate electrode and being insulated from the transistor active region.

2. The double gate MOS transistor according to claim 1, wherein the at least one semiconductor pillar is a single semiconductor pillar penetrating a portion of the transistor active region and the at least one bottom gate electrode is a single bottom gate electrode.

3. The double gate MOS transistor according to claim 1, wherein the at least one semiconductor pillar is a single semiconductor pillar dividing the transistor active region into a first transistor active region and a second transistor active region, and dividing the bottom gate electrode into a first bottom gate electrode and a second bottom gate electrode.

4. The double gate MOS transistor according to claim 3, wherein the at least one top gate electrode includes a first top gate electrode crossing over the first transistor active region and a second top gate electrode crossing over the second transistor active region, the first and second top gate electrodes overlapping with the first and second bottom gate electrodes respectively, at least one end of the first top gate electrode contacting a sidewall of the first bottom gate electrode, and at least one end of the second top gate electrode contacting a sidewall of the second bottom gate electrode.

5. The double gate MOS transistor according to claim 1, wherein the at least one semiconductor pillar includes a central semiconductor pillar intersecting the central portions of the transistor active region and the bottom gate electrode and a first semiconductor pillar and a second semiconductor pillar located at opposite sides of the central semiconductor pillar respectively, the transistor active region between the first and second semiconductor pillars being divided into a first transistor active region and a second transistor active region separated by the central semiconductor pillar, and the bottom gate electrode between the first and second semiconductor pillars being divided into a first bottom gate electrode and a second bottom gate electrode separated by the central semiconductor pillar.

6. The double gate MOS transistor according to claim 5, wherein the at least one top gate electrode includes a first top gate electrode crossing over the first transistor active region and a second top gate electrode crossing over the second transistor active region, the first and second top gate electrodes overlapping with the first and second bottom gate electrodes respectively, at least one end of the first top gate electrode being in contact with a sidewall of the first bottom gate electrode, and at least one end of the second top gate electrode being in contact with a sidewall of the second bottom gate electrode.

7. The double gate MOS transistor according to claim 1, wherein the at least one semiconductor pillar includes a first semiconductor pillar and a second semiconductor pillar located on both edges of the transistor active region and the bottom gate electrode respectively.

8. The double gate MOS transistor according to claim 7, wherein the at least one top gate electrode includes first and second parallel top gate electrodes crossing over the transistor active region, at least one end of the first and second top gate electrodes being in contact with sidewalls of the bottom gate electrode.

9. A double gate MOS transistor comprising:
   an isolation layer formed at a predetermined region of a semiconductor substrate to define a substrate active region;
   a transistor active region disposed over the substrate active region and overlapped with the substrate active region;
   a central semiconductor pillar intersecting the central portion of the transistor active region to divide the transistor active region into a first transistor active region and a second transistor active region and to contact the substrate active region, the central semiconductor pillar supporting the first and second transistor active regions so that the first and second transistor active regions are spaced apart from the substrate active region;
   a first bottom gate electrode substantially filling a space between the first transistor active region and the substrate active region, the first bottom gate electrode being insulated from the substrate active region, the first transistor active region and the semiconductor pillar;
   a second bottom gate electrode substantially filling a space between the second transistor active region and the substrate active region, the second bottom gate electrode being insulated from the substrate active region, the second transistor active region and the semiconductor pillar;
   a first top gate electrode crossing over the first transistor active region and having both ends that are in contact with sidewalls of the first bottom gate electrode; and
   a second top gate electrode crossing over the second transistor active region and having both ends that are in contact with sidewalls of the second bottom gate electrode, the first and second top gate electrodes overlapping with the first and second bottom gate electrodes respectively.

10. The double gate MOS transistor according to claim 9 further comprising an isolation impurity region formed at a surface of the substrate active region contacting the central semiconductor pillar, the isolation impurity region having a different conductive type from the semiconductor substrate.

11. The double gate MOS transistor according to claim 9, wherein a top surface of the isolation layer is located at a same level as a top surface of the substrate active region or lower than the top surface of the substrate active region.

12. The double gate MOS transistor according to claim 9, further comprising:
   a common drain region formed at the central semiconductor pillar as well as the first and second transistor active regions between the first and second top gate electrodes;

a first source region formed at the first transistor active region that is adjacent to the first top gate electrode and opposite the common drain region; and a second source region formed at the second transistor active region that is adjacent to the second top gate electrode and opposite the common drain region.

13. A double gate MOS transistor comprising:

an isolation layer formed at a portion of a semiconductor substrate to define a substrate active region;

a transistor active region disposed over the substrate active region and overlapped with the substrate active region;

a first semiconductor pillar and a second semiconductor pillar placed at both sides of the transistor active region respectively, the first and second semiconductor pillars contacting the substrate active region;

a central semiconductor pillar intersecting a central portion of the transistor active region to divide the transistor active region into a first transistor active region and a second transistor active region and to contact the active region, the central semiconductor pillar supporting the first and second transistor active regions so that the first and second transistor active regions are spaced apart from the substrate active region;

a first bottom gate electrode substantially filling a space between the first transistor active region and the substrate active region, the first bottom gate electrode being insulated from the substrate active region, the first transistor active region, the first semiconductor pillar and the central semiconductor pillar;

a second bottom gate electrode substantially filling a space between the second transistor active region and the substrate active region, the second bottom gate electrode being insulated from the active region, the second transistor active region, the second semiconductor pillar and the central semiconductor pillar;

a first top gate electrode crossing over the first transistor active region and having both ends that are in contact with sidewalls of the first bottom gate electrode; and a second top gate electrode crossing over the second transistor active region and having both ends that are in contact with sidewalls of the second bottom gate electrode, the first and second top gate electrodes overlapping with the first and second bottom gate electrodes respectively.

14. The double gate MOS transistor according to claim 13 further comprising isolation impurity regions formed at the substrate active region contacting the first and second semiconductor pillars and the central semiconductor pillar, the isolation impurity regions having a different conductive type from the semiconductor substrate.

15. The double gate MOS transistor according to claim 13, wherein a top surface of the isolation layer is located at a same level as that of the substrate active region or is lower than a level of the substrate active region.

16. The double gate MOS transistor according to claim 13, further comprising:

a common drain region formed at the central semiconductor pillar as well as the first and second transistor active regions between the first and second top gate electrodes;

a first source region formed at the first semiconductor pillar and the first transistor active region that is adjacent to the first lop gate electrode and opposite the common drain region; and a second source region formed at the second semiconductor pillar and the second transistor active region that is adjacent to the second top gate electrode and opposite the common drain region.

17. A double gate MOS transistor comprising:

an isolation layer formed at a portion of a semiconductor substrate to define a substrate active region;

a transistor active region disposed over the substrate active region and overlapped with the substrate active region;

a first semiconductor pillar and a second semiconductor pillar disposed at both sides of the transistor active region respectively, the first and second semiconductor pillars contacting the substrate active region;

a bottom gate electrode substantially filling a space between the transistor active region and the substrate active region, the bottom gate electrode being insulated from the substrate active region, the transistor active region, the first semiconductor pillar and the second semiconductor pillar; and first and second parallel top gate electrodes crossing over the transistor active region, each of the first and second top gate electrodes having both ends that are in contact with sidewalls of the bottom gate electrode, and the first and second top gate electrodes being located between the first and second semiconductor pillars to overlap with the bottom gate electrode.

18. The double gate MOS transistor according to claim 17 further comprising isolation impurity regions formed at the substrate active region contacting the first and second semiconductor pillars, the isolation impurity regions having a different conductive type from the semiconductor substrate.

19. The double gate MOS transistor according to claim 17, wherein a top surface of the isolation layer is located at a same level as that of the substrate active region or is lower than a level of the substrate active region.

20. The double gate MOS transistor according to claim 17, further comprising:

a common drain region formed at the transistor active region between the first and second top gate electrodes;

a first source region formed at the first semiconductor pillar and the transistor active region that is adjacent to the first top gate electrode and opposite the common drain region; and a second source region formed at the second semiconductor pillar and the transistor active region that is adjacent to the second top gate electrode and opposite the common drain region.

* * * * *